United States Patent
McClain

(10) Patent No.: US 9,305,614 B2
(45) Date of Patent: Apr. 5, 2016

(54) MEMORY DEVICE WITH INTERNAL COMBINATION LOGIC

(71) Applicant: Spansion LLC, Sunnyvale, CA (US)

(72) Inventor: Mark Alan McClain, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 486 days.

(21) Appl. No.: 13/725,415

(22) Filed: Dec. 21, 2012

(65) Prior Publication Data

US 2014/0177375 A1    Jun. 26, 2014

(51) Int. Cl.
  *G11C 8/00*    (2006.01)
  *G11C 7/10*    (2006.01)

(52) U.S. Cl.
  CPC ............ *G11C 7/1009* (2013.01); *G11C 7/1006* (2013.01); *G11C 2207/104* (2013.01)

(58) Field of Classification Search
  CPC ....................................................... G11C 8/00
  USPC ................................................... 365/230.01
  See application file for complete search history.

(56) References Cited

U.S. PATENT DOCUMENTS

| | | | |
|---|---|---|---|
| 6,256,252 B1 * | 7/2001 | Arimoto | 365/227 |
| 6,335,898 B2 * | 1/2002 | Watanabe et al. | 365/230.03 |
| 6,898,683 B2 * | 5/2005 | Nakamura | 711/167 |
| 8,140,797 B2 * | 3/2012 | Robini et al. | 711/163 |
| 2002/0040437 A1 | 4/2002 | Yamauchi et al. | |
| 2002/0126562 A1 | 9/2002 | Ngai et al. | |
| 2006/0101231 A1 * | 5/2006 | Higashida | 712/10 |
| 2009/0049269 A1 | 2/2009 | Kirsch et al. | |
| 2012/0075902 A1 | 3/2012 | MacWilliams et al. | |
| 2012/0213360 A1 * | 8/2012 | Le Quere | 380/28 |
| 2012/0317347 A1 | 12/2012 | Confalonieri et al. | |

OTHER PUBLICATIONS

International Search Report and Written Opinion of the International Searching Authority for International Application No. PCT/US2013/076140, mailed Apr. 28, 2014.

* cited by examiner

*Primary Examiner* — Huan Hoang
*Assistant Examiner* — Tri Hoang

(57) ABSTRACT

Embodiments of the present invention include an apparatus, method, and system for integrating data processing logic with memory. An embodiment of a memory integrated circuit is designed to execute a task on the data in a memory array within a memory integrated circuit. The memory integrated circuit can include a memory array, a data access component, a data holding component, and a logic component. The data access component can be coupled to the memory array and configured to provide an address to the memory array. The data holding component can be coupled to the memory array and configured to temporarily store the data in the memory array located at the address. The logic component can be coupled to both the data access component and the data holding component, and be configured to execute a task using data received from the data holding component. The logic component can include combinational or sequential logic.

20 Claims, 5 Drawing Sheets

MEMORY DEVICE WITH INTERNAL COMBINATION LOGIC

BACKGROUND

1. Field of Art

Embodiments in the present disclosure generally relate to improved memory architectures. More particular, embodiments relate to implementation of logic, e.g., combinational or sequential logic, connected with a memory on either a common die or connected dice, such that, the logic can process data in the memory and avoid transferring the data outside the memory die or connected set of logic and memory dice.

2. Description of the Background Art

As technology improves, the speed of data processing has increased at an exponential rate. With the improvements have come consumer expectations that applications running on computers would improve at a similar rate.

As processing speed has continued to improve, bottlenecks are becoming apparent in the memory related areas of computer design. For example, latency in accessing memory has become a significant issue in current computer design. Many improvements have been explored in an attempt to address this issue. For example, multiple levels of cache have been used to provide faster access to memory based on how often or recent data has been accessed. For example, some current systems have three levels of cache and a main memory (RAM) in addition to the traditional hard drive disk used to store memory. In such example systems, the first level of cache may only require 4 cycles to access but may only be able to store 64K bytes of data. The second level may require 10 cycles to access, but may be able to store 512K bytes of data. The third level may require 40 cycles to access, but may be able to store 2 MB of data. Random Access Memory (RAM) can store an additional 4-8 GB of data, for example, but may take 6000 cycles to access. But all of these memory components are faster than a hard drive, which may store 100s of GBs of data, but may take 10s or 100s of thousands of cycles to access.

SUMMARY

Therefore, data processing system performance may be increased by executing common memory intensive processes without requiring the transfer of contents (data) between the memory integrated circuit and a separate processing unit.

An embodiment includes a memory integrated circuit designed to execute a task on the data in a memory array within a memory integrated circuit. The memory integrated circuit can include a memory array, a data access component, a data holding component, and a logic component. The data access component can be coupled to the memory array and configured to provide an address to the memory array. The data holding component can be coupled to the memory array and configured to temporarily store the data in the memory array located at the address. The logic component can be coupled to both the data access component and the data holding component, and be configured to execute a task using data received from the data holding component. In an embodiment, the logic component can include combinational or sequential logic.

Another embodiment includes a central processing unit (CPU) and a system memory integrated circuit, coupled to the CPU, designed to execute a task on the data in a memory array within the system memory integrated circuit. The system memory integrated circuit can include a memory array, a data access component, a data holding component, and a logic component. The data access component can be coupled to the memory array and configured to provide an address to the memory array. The data holding component can be coupled to the memory array and configured to temporarily store the data in the memory array located at the address. The logic component can be coupled to both the data access component and the data holding component, and be configured to execute a task using data received from the data holding component. In an embodiment, the logic component can include combinational or sequential logic.

Another embodiment includes a method for processing data within a memory integrated circuit. The method includes determining the memory address, retrieving data from a memory array located at the memory address, executing a task using the data to produce a result, and returning the result if the result satisfies an exit condition.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

BRIEF DESCRIPTION OF THE DRAWINGS

The accompanying drawings, which are incorporated herein and form a part of the specification, illustrate some embodiments and, together with the description, further serve to explain the principles of the invention and to enable a person skilled in the relevant art to make and use the invention.

Figure 1:
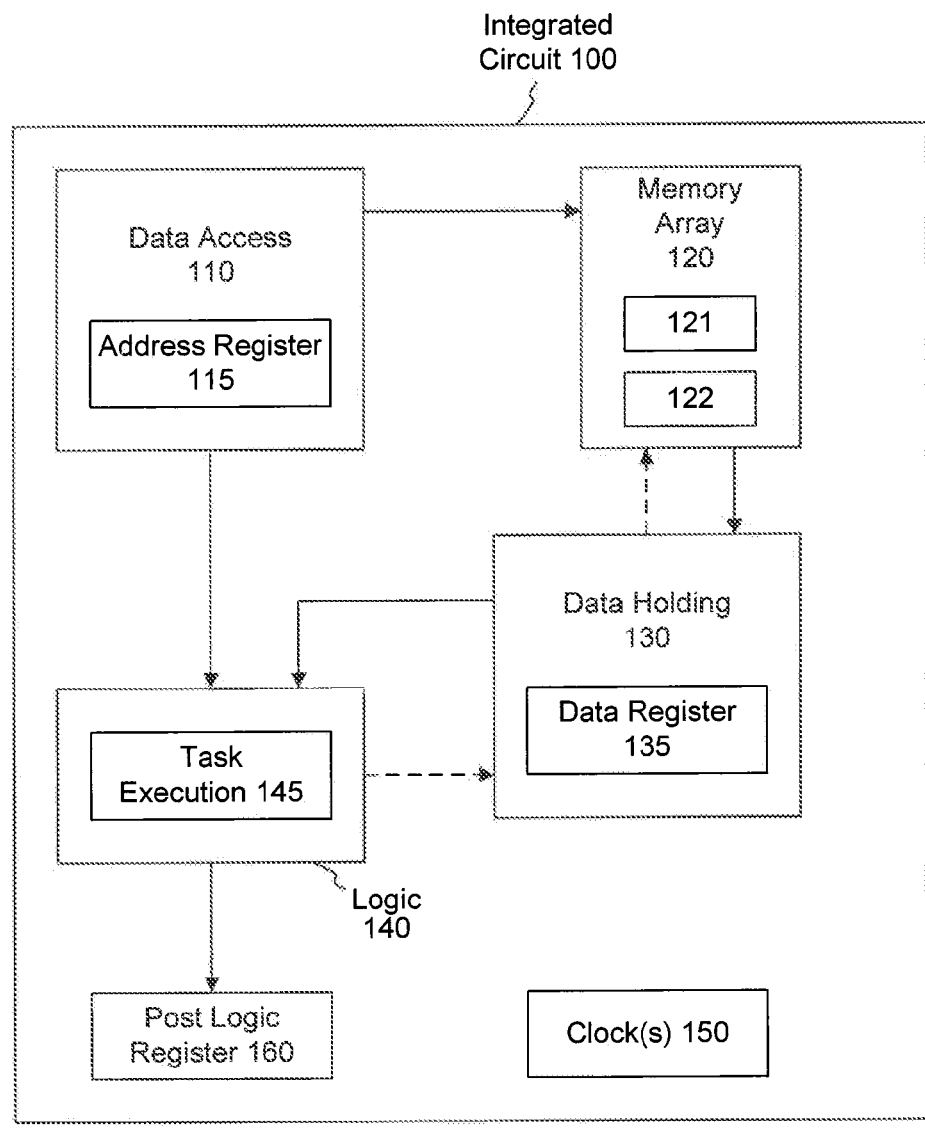
FIG. 1 is a block diagram of an exemplary memory system of an improved memory architecture with attached logic, all in a single integrated circuit according to an embodiment.

The features and advantages of embodiments of the present invention will become more apparent from the detailed description set forth below when taken in conjunction with the drawings. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the scope of the claimed subject matter. Rather, the scope of the claimed subject matter is defined by the appended claims.

It would be apparent to a person skilled in the art that the present invention, embodiments of which are described below, can be implemented in many different embodiments of software, hardware, firmware, and/or the entities illustrated in the figures. Thus, the operational behavior of embodiments of the present invention will be described with the understanding that modifications and variations of the embodiments are possible, given the level of detail presented herein.

This specification discloses one or more systems that incorporate the features of embodiments of the invention. The disclosed systems merely exemplify the invention. The scope of the invention is not limited to the disclosed systems or embodiments.

The systems described, and references in the specification to "one system", "a system", "an example system", etc., indicate that the systems described may include a particular feature, structure, or characteristic, but every embodiment may not necessarily include the particular feature, structure, or characteristic. Moreover, such phrases are not necessarily referring to the same system. Further, when a particular feature, structure, or characteristic is described in connection with a system, it is understood that it is within the knowledge of one skilled in the art to affect such feature, structure, or characteristic in connection with other embodiments whether or not explicitly described.

Solely for the purposes of illustration, an example embedded search algorithm is used herein to describe certain embodiments. Persons skilled in the art will appreciate that such embodiments are not limited to this example, and are instead applicable in multiple other contexts and any other memory intensive operations, such as, but not limited to, Graph traversal, Hidden Markov Model (HMM) processing, etc.

1. MEMORY WITH INTERNAL LOGIC

According to an embodiment, FIG. 1 illustrates an Integrated Circuit 100. Integrated Circuit 100 includes a Data Access Component 110, Memory Array 120, Data Holding Component 130, and Logic Component 140. Data Access Component can comprise an Address Register 115. Memory Array 120 can comprise multiple memory locations, for example Memory Locations 121 and 122. Data Holding Component 130 can comprise one or more Data Registers 135. Logic Component 140 can be dedicated, hard-coded logic or a programmable algorithmic unit designed to perform a specific task or set of tasks.

In Integrated Circuit 100, Data Access Component 110 and Data Holding Component 130 can include registers. These registers can be comprised of D flip-flops, for example.

Integrated Circuit 100 can also include Clock Component 150, which can comprise one or more clocks (not shown). Some clocks can be synchronized with external elements, for example to determine when data is collected and transmitted. Other clocks can be synchronized with each other to correctly time data as it is processed by different components, for example Logic Component 140. The use of multiple clocks allows the components within Integrate Circuit 100 to run at a different speed than the speed at which data can be received or sent by Integrated Circuit 100.

In an embodiment, Logic Component 140 includes logic blocks. In an embodiment, the logic blocks can be combinational logic blocks. The combinational logic blocks can be separated by staging registers, which can be D flip-flops, for example. The combinational logic blocks and staging registers can be designed in a linear alternating pattern thereby creating a sequential logic (pipelined) architecture. Many other configurations are possible depending on design goals. The staging registers can use the same or different clocks to determine the timing of latching data.

In an embodiment, Memory Array 120 can be read only or random access memory. For example, Memory Array 120 can be static random access memory (SRAM).

In an embodiment, Integrated Circuit 100 is configured such that data in Memory Array 120 is not modified by the Logic Component 140. For example, Logic Component 140 can receive data from Memory Array 120, and can execute tasks on the data, but is configured such that it does not modify the contents of Memory Array 120, i.e., Logic Component 140 is not configured to store any intermediary or final results in Memory Array 120. In an embodiment, Logic Component 140 is not configured to support the functionality of Memory Array 120. For example, Logic Component does not provide address translation assistance, memory cell failure assistance, or in any other way assist with the functioning of Memory Array 120. In an embodiment, although on the same integrated circuit, Logic Component 140 is structurally and functionally separate from, and independent from, Memory Array 120. Thus, in embodiments, Logic Component 140 does not support the functionality of Memory Array 120, modify Memory Array 120, and/or in any way affect the data stored within Memory Array 120 and/or the execution of tasks performed by Memory Array 120.

Figure 2:
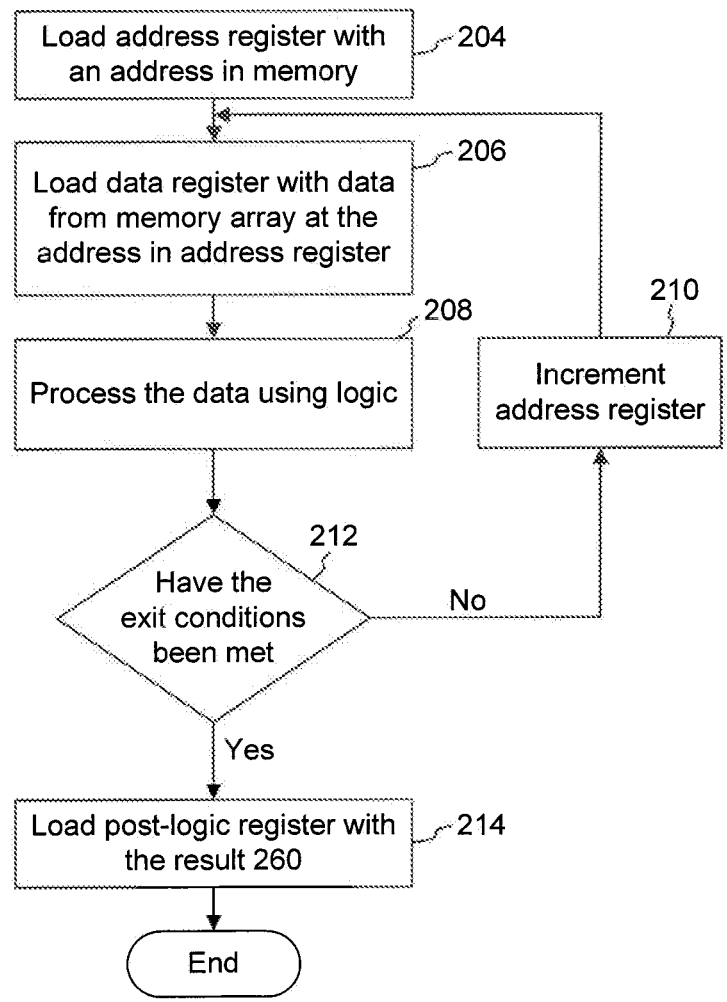
FIG. 2 is a flowchart of an exemplary method performed by an incorporated memory architecture with attached logic, such as that shown in FIG. 1, according to an embodiment.

FIG. 2 is a flowchart 202 illustrating steps by which memory can by processed using logic located and integrated on the same silicon die as the memory. For illustrative purposes, flowchart 202 is described with continued reference to Integrated Circuit 100 in FIG. 1, but flowchart 202 is not limited to this example.

In step 204, an address register is loaded with an address indicating a first location in a memory array that is to be processed. The address can be provided by an external source, pre-loaded into an internal memory location, or hard-coded to a predefined location. For example, in an embodiment, the Address Register 115 can be loaded with the address of the Memory Location 121 in Memory Array 120.

In step 206, a data register is loaded with the data in a memory array located at the address pointed to by the address register. For example, in an embodiment, Data Register 135 in Data Holding Component 130 can be loaded with the data in Memory Location 121 in Memory Array 120, pointed to by Address Register 115.

In step 208, logic, e.g., combinational or sequential logic, performs a pre-defined task on the data in the data register. For example, in an embodiment, Logic Component 140 performs a task using Task Execution Component 145 on the data in Data Register 135 in Data Holding Component 130. In an embodiment, the Logic Component 140 can take advantage of the wide data buses available within integrated circuit 100, since all the components are located on a single integrated circuit. In an embodiment, Logic Component 140 can be combinational logic. The combinational logic may perform multiple tasks. The user can provide additional information used to select the appropriate task. In an embodiment, the task can take one or more clock cycles, depending on its complexity. For example, in an embodiment, if Task Execution Component 145 takes more than one cycle, Integrated Circuit 100 can be designed to pipeline the execution of Task Execution Component 145 to improve performance. In an embodiment, the tasks performed in logic cannot modify the memory.

In step 212, the results from the logic are tested against a set of exit conditions. For example, the exit conditions may test whether a search string has been found or the end of a graph has been encountered.

If the test fails, the process continues to step 210 where the address in the address register is modified and control is returned to step 206. For example, in an embodiment, if Task Execution Component 145 determines that the task is not complete, it can modify Address Register 115 to point to a new location in Memory Array 120, for example Memory Location 122.

If the exit conditions have been met, the process continues to step 214, where a post-logic register is loaded with the results from the logic. For example, in an embodiment, Task Execution Component 145 can store the results in Post Logic Register 160. At that point the process 200 is complete.

Persons skilled in the art will appreciate that this is but one method of using Integrated Circuit 100. For example, step 210 could be replaced with modifying the address register based on the results of the logic, for example in graph traversal applications. Also, step 214 could be amended to allow for updating a valid register to indicate that the value in the post-logic register is valid. The system may also accept additional input. In an embodiment, the combinational logic may be staged to perform more complex tasks. This may require additional control data or additional task specific data. In an embodiment, the logic may return task results to the Data Holding Component 130 and the Data Holding Component 130 may transfer the results to the Memory Array 120 (illustrated as dotted line paths in Integrated Circuit 100). Persons skilled in the art will appreciate these are some examples of possible modifications, and that other modifications are also possible.

2. SEARCH FUNCTIONALITY EMBODIMENT

Memory search is an extremely time consuming and memory access intensive process. The process entails requesting data from a specific address in memory, transferring that data to a separate processor, and comparing the data to a search string. If a match is found, then the process ends. If not, the process repeats using new data from the next address in memory.

Because memory arrays can be very large, this process can consume a significant amount of time. A large portion of this time is consumed by the transfer of data from the memory to the processor, as opposed to executing any algorithms on the data. This is especially the case when the memory is located outside of a cache on the processor chip. By incorporating dedicated logic onto the same integrated circuit as the memory as described herein, both data transfer latency and search execution latency can be significantly reduced.

a. Structure

Figure 3A:
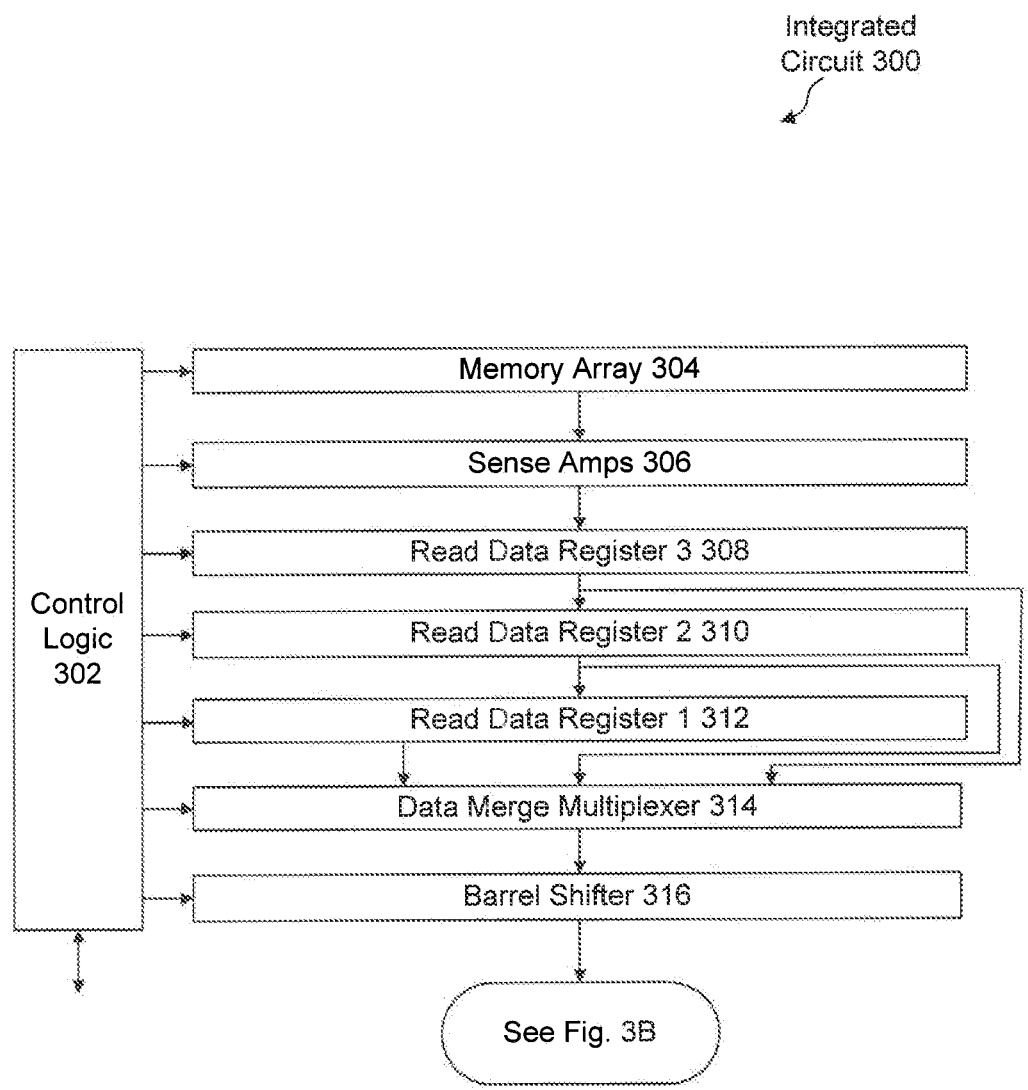
FIGS. 3A and 3B collectively illustrate is a block diagram of an exemplary memory system with dedicated search hardware, all in an integrated circuit, according to an embodiment.
Figure 3B:
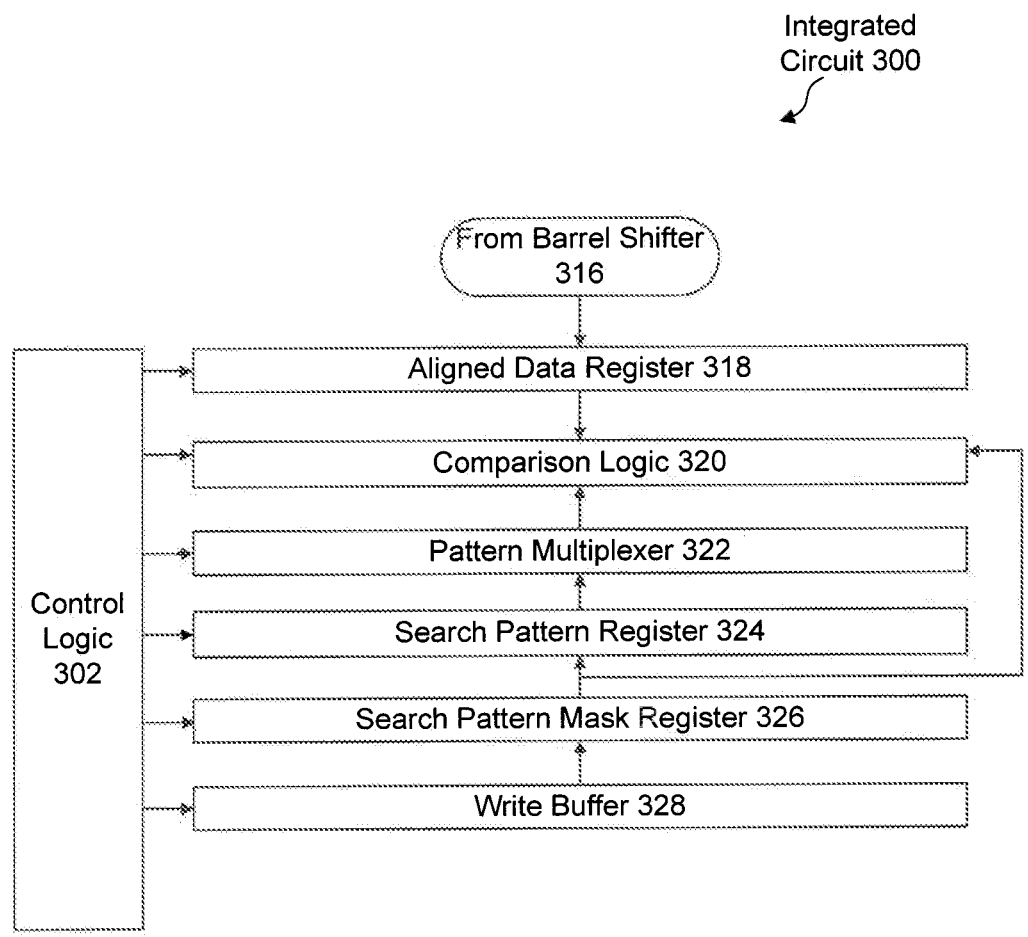

FIGS. 3A and 3B collectively illustrate an Integrated Circuit 300. Integrated Circuit 300 can be an embodiment of Integrated Circuit 100. Integrated Circuit 300 includes a Control Logic 302, Memory Array 304, Sense Amps 306, Read Data Registers 3, 2, and 1 (308, 310, and 312 respectively), Data Merge Multiplexer 314, Barrel Shifter 316, Aligned Data Register 318, Comparison Logic 320, Pattern Multiplexer 322, Search Pattern Register 324, Search Pattern Mask Register 326, and Write Buffer 328. In an embodiment, all of these components are implemented in a single integrated circuit, i.e., Integrated Circuit 300.

Memory Array 304 can be the same as Memory 120 that contains memory locations 121 and 122. Memory Array 304 is in communication with Control Logic 302, which can control what memory addresses are read from Memory Array 304.

Read Data Registers 3, 2, and 1, 308, 310, and 312 respectively, can be elements within Data Holding Component 130 of Integrated Circuit 100, as shown, and can provide continuous access to sequential blocks of data from Memory Array 120. While three Read Data Registers are illustrated and described here, a person skilled in the art would understand that more or fewer Read Data registers could be used, depending on the requirements of Integrated Circuit 300.

Data Merge Multiplexer 314 can be an element within Logic 140, such as an element within Task Execution 145. In an embodiment, Data Merge Multiplexer 314 can be configured to collect data from Read Data Registers 3, 2, and 1. For example, Control Logic 302 can be configured to provide information to Data Merge Multiplexer 314 about what information it will accept from each of Data Read Registers 3, 2, and 1.

Barrel Shifter 316 can be an element within Logic 140, such as an element within Task Execution 145. In an embodiment, Barrel Shifter 316 can be configured to rotate the data, e.g., barrel shift the data to replace bytes shifted off the end of the data to the beginning of the data, in order to align the data correctly. For example, Control Logic 302 can be configured to provide information, such as the number of bytes to shift the data, to Barrel Shifter 316. In one example, if Data Merge Multiplexer 314 accepted the left most (low address) 10 bytes of data from Read Data Register 2 and the right most (high address) six bytes of data from Read Data Register 1, Control Logic 302 can inform a sixteen byte Barrel Shifter 316 to shift the Data Merge Multiplexer 314 combined (concatenated) data from Read Data Registers 1 and 2. This would put the 6 bytes of data from Read Data Register 1 to the left of the 10 bytes of data from Read Data Register 2 such that the data output from the Barrel Shifter 316 is aligned with the last 6 bytes of Read Data Register 1 followed by the first 10 bytes of Data Register 2, forming a string of lower to higher address data bytes. This combination of data registers, merge multiplexer, and barrel shifter allow strings of memory data to be aligned on any byte address boundary rather than on some binary multiple of bytes that may be the alignment of data within the memory array. A person skilled in the art would understand that Barrel Shifter 316 can be configured in many ways, for example to address Big Endian and Little Endian data formats.

Aligned Data Register 318 can be an element within Logic 140, such as an element within Task Execution 145. In an embodiment, Aligned Data Register 318 can be configured to store the results from Barrel Shifter 316.

As discussed above, Write Buffer 328 can be an element of Data Access 110. In an embodiment, Write Buffer 328 can be configured to store data received from an external source. For example, Write Buffer 328 can be configured to store a Search Pattern and Search Pattern Mask.

Search Pattern Mask Register 326 can be an element within Logic 140, such as an element within Task Execution 145. In an embodiment, Search Pattern Mask Register 326 can be configured to store the Search Pattern Mask. For example Control Logic 302 can be configured to determine what data from Write Buffer 328 should be stored in Search Pattern Mask Register 326.

Search Pattern Register 324 can be an element within Logic 140, such as an element within Task Execution 145. In an embodiment, Search Pattern Register 324 can be configured to store the Search Pattern. For example, Control Logic 302 can be configured to determine what data from Write Buffer 328 should be stored in Search Pattern Register 324. In another example, Control Logic 302 can be configured to first store the Search Pattern in the Search Pattern Mask Register 326. Control Logic 302 can also be configured to then store the Search Pattern in the Search Pattern Register 324 and store the Search Pattern Mask in Search Pattern Mask Register 326.

Pattern Multiplexer 322 can be an element within Logic 140, such as an element within Task Execution 145. In an embodiment, Pattern Multiplexer 322 can select the portion of data in the Search Pattern Register 324 that will be compared with the data in Aligned Data Register 318. In an embodiment, Pattern Multiplexer 322 can be configured to route the first byte of the Search Pattern to all byte inputs of the Comparison Logic 320. The Control Logic 302 can be configured to direct the Comparison Logic 320 to compare each byte of the Aligned Data Register 318 with the first byte in the Search Pattern 324 provided through the Pattern Multiplexer 322. This will compare all bytes in the Aligned Data Register 318 with the first byte in the Search Pattern 324 simultaneously. This enables the search to proceed through information from the memory quickly by checking for the first search byte within multiple bytes of memory in parallel. When a match to the first byte in the search pattern is found the Read Data Registers content can be re-aligned to place the first matching byte in the first byte of the aligned data register. In an embodiment, Pattern Multiplexer 322 can be configured to route each byte of the Search Pattern to the same location byte input of the Comparison Logic 320 with the Search Pattern Mask bits indicating to the Comparison Logic 320 which bits of the Search Pattern are to be matched. This enables multiple bytes of the search pattern to be compared with the aligned data bytes in parallel to determine if there is a multiple byte match with the search pattern.

Comparison Logic 320 can be an element within Logic 140, such as an element within Task Execution 145. In an embodiment, Comparison Logic 320 can be configured to store the results of a logical comparison of the data in Aligned Data Register 318 and Pattern Multiplexer 322. In an embodiment, Comparison Logic 320 can be configured to only compare bits that the Search Pattern Mask indicate are important.

Persons skilled in the art would recognize that this is one embodiment of an embedded search functionality and that other arrangements are possible.

b. Method

Figure 4:
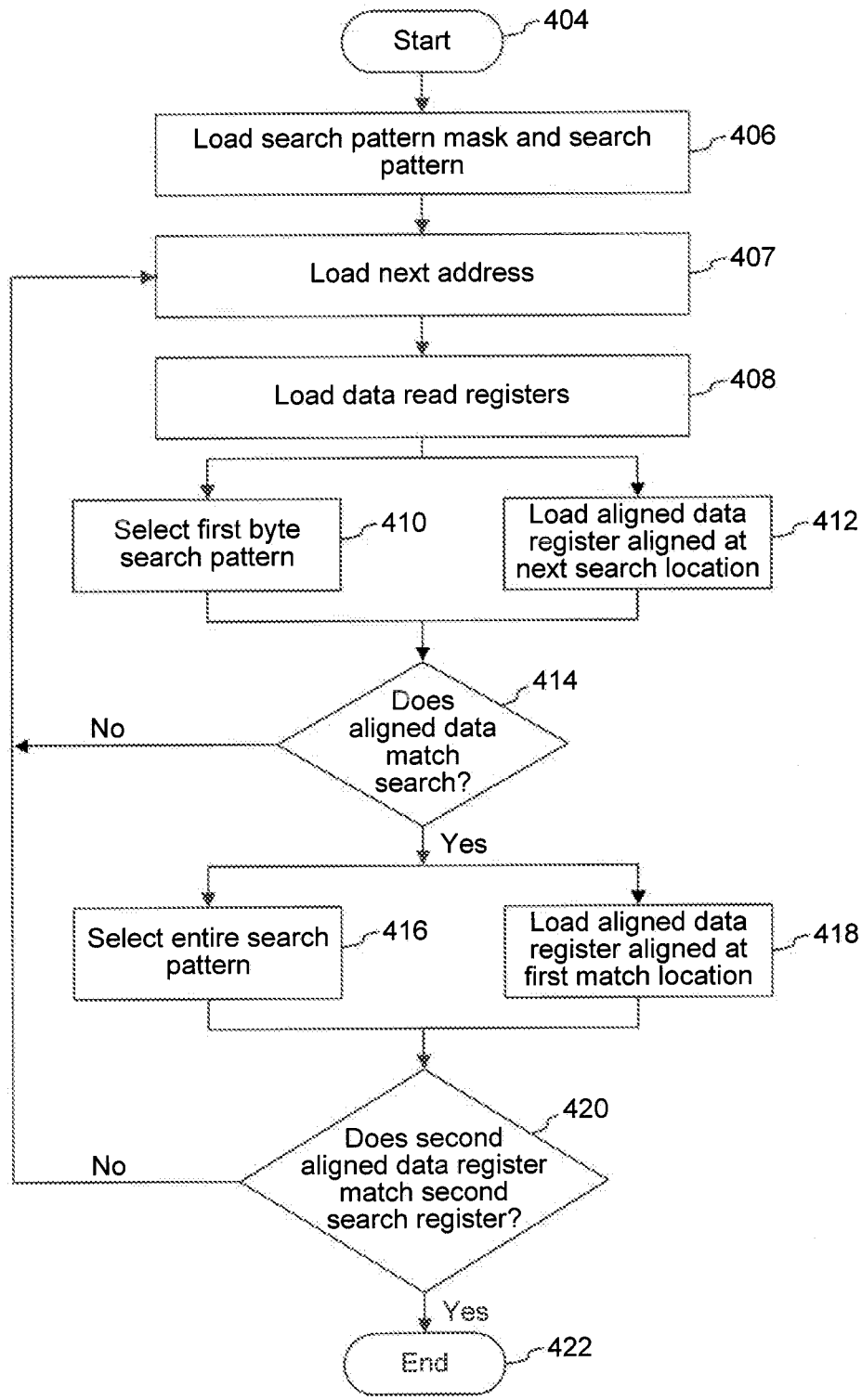
FIG. 4 is a flowchart of an exemplary search method performed by dedicated search hardware, such as shown in FIGS. 3A and 3B, according to an embodiment.

FIG. 4 is a flowchart 402 illustrating steps by which memory can be searched using logic located on the same silicon die. For illustrative purposes, flowchart 402 is described with continued reference to Integrated Circuit 300 in FIGS. 3A and 3B, as well as integrated circuit 100 from FIG. 1, although flowchart 402 is not limited to this example. In step 406, a search pattern mask register and search pattern register are loaded from an external source. For example, in an embodiment, Search Pattern Mask Register 326 and Search Pattern Register 324 are loaded from an external source, for example using Control Logic 302 and Write Buffer 328. In step 407, an address register is loaded from an external source with the next address to be processed. For example, Address Register 115 is loaded from an external source, for example using Control Logic 302 and Write Buffer 328. In an embodiment, the address register can also be loaded with the starting byte address for the search. For example, an offset register can point to the $10^{th}$ byte, indicating that the search will start with the $10^{th}$ byte in read data registers.

In step 408, the read data registers can be loaded with the data located in Memory Array 304 at the addresses starting with the address in the address register, and the address register can be incremented to point to the next memory address. For example, in an embodiment, Read Data Registers 308, 310, and 312 are loaded with data from Memory Array 304 starting with the location in Address Register 115. In an embodiment, Address Register 115 can then be incremented to point to the next address in Memory Array 304.

In step 410, a pattern multiplexer, for example Pattern Multiplexer 322, is configured such that each output byte is a copy of the first byte of the search pattern register. For example, Pattern Multiplexer 322 is configured to output the first byte from Search Pattern Register 324 on all outputs going to the Comparison Logic 320. In an embodiment, the first byte of the search pattern mask register can be used to mask the bits that are not important for the search.

In step 412, the data from the read data registers are merged, for example using Data Merge Multiplexer 314. In an embodiment, Data Merge Multiplexer 314 can merge data from Data Registers 3, 2, and 1. For example, if the offset register indicates that the search is to start with the $10^{th}$ byte of Read Data Register 1, Data Merge Multiplexer 314 can route the first 10 bytes of data from Read Data Register 2 and the last 6 bytes of data from Read Data Register 1 to the input of the Barrel Shifter 316. The data can then be shifted, for example using Barrel Shifter 316, so that the byte pointed to by the Address Register is located in the first byte of the aligned data register. In the above example, Barrel Shifter 316 can then shift the data; for example using a barrel shift, to align the data from Read Data Register 1 before the data from Read Data Register 2. Aligned Data Register 318 can be loaded with the aligned data.

In step 414, the data in an alignment register, for example the Aligned Data Register 318, is compared with the data from the pattern multiplexer, for example Pattern Multiplexer 322. In an embodiment, this allows the process to identify possible locations to start a pattern match. For example, Aligned Data Register 318 can be Logically XNORed with Pattern Multiplexer 322. In an embodiment, if any of the bytes return all "1"s then that byte is considered to match. In an embodiment, the results are further compared with the first byte of Search Pattern Mask Register 326 to determine if each of the bits of interest matches.

If no bytes match, the process returns to step 407 to load the next address to be searched. If at least one byte matches, the process continues to steps 416 and 418.

In step 416, the pattern multiplexer register selects the entire search pattern register as input to the Comparison Logic 320. In an embodiment, Search Pattern Mask Register 326, is loaded such that if a bit is 1, then the bit in the data, for example in Aligned Data Register 316, must match that bit in the search pattern register, for example Search Pattern Register 324.

In step 418, the data from the read data registers is stored in an aligned data register, based on the location of the first matching byte found in step 414. For example, the Data Merge Multiplexer can select data from Read Data Registers 3, 2, and 1 based on the matching byte location found in step 414. In an embodiment, the merged data can be shifted to align the data. For example, a barrel shifter, such as Barrel Shifter 316, can barrel shift the merged data based on the matching byte location found in step 414.

In step 420, the data in the aligned data register is compared with the data from the pattern multiplexer. For example, in an embodiment, Comparison Logic 320 can compare the data from Aligned Data Register 318 and Pattern Multiplexer 322. In an embodiment, the search pattern mask in Search Pattern Mask Register 326 can also select the bit locations to match in the Comparison Logic. In an embodiment, this comparison is done using the following logical operation, and the result is tested to make sure it is all 1s:

Result=(ADR xnor PM) or not (SPMR)

Where:
ADR—Aligned Data Register
PM—Pattern Multiplexer
SPMR—Search Pattern Mask Register If the data does not match, the process returns to step 407. If the data does match, the process continues to step 422 and ends.

3. CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A memory integrated circuit (IC), comprising:
a data access component configured to provide an address;
a memory array, coupled to the data access component, configured to receive the address provided by the data access component and provide data stored at a location associated with the address;
a data holding component, coupled to the memory array, configured to receive the data provided by the memory array; and
a logic component, coupled to the data access component and the data holding component, unrelated to the memory array, configured to receive the data from the data holding component, execute a dedicated task using the data, and determine if an exit condition has been met, wherein the exit condition tests whether a search string has been found or whether an end of a graph has been encountered.

2. The memory IC of claim 1, wherein:
the logic component is connected to the data access component; and
the logic component is further configured to indicate that the exit condition has not been met to the data access component when the logic component determines that the exit condition has not been met.

3. The memory IC of claim 2, wherein data access component is further configured to modify the address provided to the memory array when it receives an indication that the exit condition has not been met.

4. The memory IC of claim 1, further comprising a results component, connected to the logic component, configured to store a final result from the logic component when the exit condition has been met.

5. The memory IC of claim 1, wherein the logic component further comprises:
a first combinational logic block and a second combinational logic block; and
a staging register;
wherein the staging register receives an input from the first combinational logic block and sends an output to the second combinational logic block.

6. The memory IC of claim 1, further comprising:
input registers and output registers connected to the data access component and the logic component respectively; and
at least two clocks, wherein a first clock is connected to the input and output registers and a second clock is connected to the memory array, data access component, data holding component, and logic component.

7. The memory IC of claim 1, wherein the memory array consists of non-volatile memory.

8. The memory IC of claim 1, wherein the task executed by the logic component does not modify any data in the memory array.

9. The memory IC of claim 1, wherein the task executed by the logic component processes multiple bytes of data in parallel by taking advantage of a wide bus of the memory IC.

10. A method for processing data within a memory integrated circuit (IC), the memory IC comprising a memory array and a logic component unrelated to the function of the memory array, comprising:
determining a memory address;
retrieving data from the memory array at the memory address;
executing a dedicated task using the data to produce a result; and
returning the result if the result satisfies an exit condition, wherein the exit condition tests whether a search string has been found or whether an end of a graph has been encountered.

11. The method of claim 10, further comprising receiving initial external data from an external source, wherein the determining uses the initial external data.

12. The method of claim 10, further comprising receiving a second data from an external source wherein the executing uses the second data.

13. The method of claim 10, wherein the executing takes more than one clock cycle and the executing is pipelined to allow multiple data to be handled substantially concurrently.

14. The method of claim 10, wherein the executing does not modify the memory array.

15. The method of claim 10, wherein the executing processes multiple bytes of data in parallel.

16. A system, comprising:
a central processing unit (CPU); and
a system memory integrated circuit (IC) coupled to the CPU, wherein the system memory IC comprises:
an data access component configured to provide an address a memory array, coupled to the data access component, configured to receive the address provided by the data access component and provide data stored at a location associated with the address;

a data holding component configured to receive the data from the memory array; and a logic component, unrelated to the memory array, configured to receive the data from the data holding component, execute a task using the data, and determine if an exit condition has been met, wherein the exit condition tests whether a search string has been found or whether an end of a graph has been encountered.

17. The system of claim 16, wherein:

the logic component is connected to the data access component; and the logic component is further configured to indicate that the exit condition has not been met to the data access component when the logic component determines that the exit condition has not been met.

18. The system of claim 16, wherein the logic component further comprises:

a first combinational logic block and a second combinational logic block; and a staging register;

wherein the staging register receives an input from the first combinational logic block and sends an output to the second combinational logic block.

19. The system of claim 16, wherein the memory array consists of non-volatile memory.

20. The system of claim 16, wherein the task executed by the logic component does not modify any data in the memory array.

* * * * *